(12) United States Patent
Rogers et al.

(10) Patent No.: US 6,888,253 B1
(45) Date of Patent: May 3, 2005

(54) INEXPENSIVE WAFER LEVEL MMIC CHIP PACKAGING

(75) Inventors: Harvey Newell Rogers, Playa Del Rey, CA (US); Mark Kintis, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/799,062

(22) Filed: Mar. 11, 2004

(51) Int. Cl.[7] .............................................. H01L 23/48
(52) U.S. Cl. ..................... 257/774; 257/775; 257/750; 257/758; 257/759
(58) Field of Search ................................ 257/774, 775, 257/750, 758, 781, 784

(56) References Cited

U.S. PATENT DOCUMENTS

| | | | | |
|---|---|---|---|---|
| 5,229,647 A | * | 7/1993 | Gnadinger | 257/785 |
| 6,002,180 A | * | 12/1999 | Akram et al. | 257/783 |
| 6,075,712 A | * | 6/2000 | McMahon | 361/783 |
| 6,300,688 B1 | * | 10/2001 | Wong | 257/786 |
| 6,362,528 B2 | * | 3/2002 | Anand | 257/758 |

* cited by examiner

*Primary Examiner*—Jasmine Clark
(74) *Attorney, Agent, or Firm*—Ronald M. Goldman; Scot Hewitt

(57) ABSTRACT

An inexpensive package for a semiconductor chip (1) that incorporates a stress relief buffer (13) between a side of the chip and the metal carrier layer (2) to absorb thermally induced stress produced by significantly different rates of thermal expansion of the wafer and the metal carrier. The buffer (13) is formed by a polymer that is flexible and can be etched, contains a coefficient of thermal expansion that does not significantly differ from that of the chip and/or a combination of CET and elasticity that retains a physical connection with the side of the chip and the metal carrier over the temperature range of operation anticipated for the chip. Polyimide or paraylene are preferred examples. Vias (15) extend through the buffer to place the metal carrier electrically in common with the metal layer (5) found on the back surface of the wafer so that an electrical ground applied to the metal carrier layer (2) may extend through to that surface.

8 Claims, 1 Drawing Sheet

INEXPENSIVE WAFER LEVEL MMIC CHIP PACKAGING

FIELD OF THE INVENTION

This invention relates to packaging of semiconductor chips, and, more particularly, to a new and inexpensive technique for the packaging of monolithic microwave integrated circuit chips that minimizes thermally induced mechanical stresses and to the packaged chip assembly resulting therefrom.

BACKGROUND

By definition a monolithic microwave integrated circuit ("MMIC") device contains all of the active and passive circuit elements and associated interconnections formed either in site on or within a semi-insulating substrate, such as a semiconductor, or insulating substrate by one or more well known deposition processes. Typically the MMIC device is formed on a semiconductor chip (or group of semiconductor chips) and the chip is (or chips are) assembled into a package.

A first step in the packaging of a semiconductor chip for a MMIC circuit application is to attach the chip to a metal carrier, suitably a carrier of conventional aluminum alloys, which serves as the floor of the chip package. Typically, the chip in that application is formed of either Gallium Arsenide ("GaAs") or Indium Phosphide ("InP") with a thin metal layer, referred to as the back metal layer, covering the back side of the chip. Direct attachment of the chip to the carrier by means of solder or epoxy is impractical due to the thermo-mechanical mismatch between the GaAs or InP material of the chip and the aluminum alloy carrier. That mismatch results from the large difference in the respective coefficients of thermal expansion ("CTE") of both GaAs and InP with the CTE of aluminum. Since the backmetal layer of the chip is so thin relative to the thickness of the semiconductor material, the CTE of the thicker semiconductor material predominates, and the CTE of the backmetal layer may be ignored. Because of the foregoing difference in the CTE, upon heating, the aluminum alloy carrier expands faster than the semiconductor chip. That in turn produces undue levels of stress on the chip when the chip and carrier are rigidly bonded together by a bonding agent that is incapable of providing stress relief. In that circumstance, the chip usually cracks, rendering the electronic circuits fabricated on the chip inoperative.

One known means of bonding metal to metal as could possibly be used to attach chip-to-carrier is solder; another is with conductive epoxy. Solder, however, possesses a relatively high elastic modulus and low percent elongation characteristic, and, therefore, is incapable of acting as a stress buffer between the chip and the aluminum carrier during thermal expansion. The same characteristic and inability generally exists when epoxy is used as the bonding agent. Although epoxy has been found acceptable in some instances with some chips, the reliability as a thermal stress buffer in applicant's view has not been universally consistent.

For the foregoing reasons, either A40 material, an aluminum silicon alloy, or Kovar material, an iron-nickel-cobalt alloy, are currently used as carrier materials. Those known materials are found to decrease the CTE mismatch between chip and carrier. The A40 material is expensive and brittle. The brittleness makes the material difficult to machine to the geometry desired for the carrier. Outweighing the foregoing disadvantage, the CTE of the A40 material is a better match to that of the GaAs and InP chips, and makes that bonding material desirable for a chip carrier. Kovar has an excellent CTE match to that of GaAs and InP, but possesses a low thermal conductivity and high density. That material is also hard and, hence, is difficult to machine.

Accordingly, an object of the present invention is to minimize thermally induced stress on packaged MMIC chips.

Another object of the invention is to provide a wafer-level package for MMIC chips that minimizes or avoids the need for hermetically sealed packages.

The chip package contains the carrier layer, that serves as the package floor, but also side walls and a cap or lid. For space borne applications the package is often required to be hermetically sealed so as to prevent entry of gas or other unwanted particles. Hermetically sealed packages require the lid to be welded to the side walls and is otherwise quite rugged, resulting in a package that is relatively heavy, housing a chip that is relatively light in weight, a package that weighs considerably more than one that is not hermetically sealed.

An additional object of the invention is to protect the MMIC chip from moisture, gas or other unwanted particles without the need to hermetically seal the package.

SUMMARY OF THE INVENTION

In accordance with the foregoing objects, an inexpensive package for a semiconductor MMIC chip incorporates a stress relief buffer that absorbs thermally induced stress between the chip and the metal carrier that is produced by significantly different rates of thermal expansion of the chip and the metal carrier, providing a more reliable package. The buffer is formed by a polymer and thin metal sandwich integrally formed against the back metal on the underside of the chip, and is attached to the package carrier by solder. The polymer possesses a combination of elasticity and thermal expansion coefficient that is sufficient to provide stress relief between chip and carrier over the anticipated temperature range of operation and is capable of being chemically etched, capable of accepting a metal plating and is electrically non-conductive. Preferred polymers are polyimide and Parylene. Vias extend through the stress relief buffer to place the metal underside of the buffer and carrier layer of the package electrically in contact with the back metal layer on the back surface of the chip.

In accordance with another feature of the invention a layer of polymer, suitably the same polymer material used to construct the stress relief buffer covers the upper surface of the chip and seals and protects the electronic circuits formed on the upper surface of the chip.

The foregoing and additional objects and advantages of the invention, together with the structure characteristic thereof, which were only briefly summarized in the foregoing passages, will become more apparent to those skilled in the art upon reading the detailed description of a preferred embodiment of the invention, which follows in this specification, taken together with the illustrations thereof presented in the accompanying drawings.

DESCRIPTION OF THE PREFERRED EMBODIMENTS

MMIC chips intended for multi-chip modules ("MCMs") are formed in and detached from wafers of semiconductor material using known processes, the details of which are not material to or necessary for an understanding of the present invention. The multi-chip module contains two or more of such MMIC chips that are positioned in respective compartments of the module as prescribed by the designer. Those MMIC chips are typically connected in circuit and function together to accomplish whatever the functions intended by the designer of the MCM. The functional electronic devices, integrated circuit semiconductor devices, formed in and/or on the chip are accessible on upper surface of the chip. Essentially the MCM serves as the package for the MMIC chip. A thin metal layer, referred to as the ground plane layer or as the back metal, is formed on and covers the flat bottom surface of the chip. That back metal is the surface that attaches to the metal carrier, which serves as a floor of the MCM and, typically, as an electrical ground connection.

The chip typically contains vias, small electrical conductors that are formed through the chip to provide an electrical connection between the upper and lower chip surfaces. The vias extend through the depth of the wafer to electrically connect the back metal layer on the under side to those via pads and circuit locations on the upper surface of the wafer that are required by the design for proper circuit operation, such as, as example, extending a connection to electrical ground. In assembly of the MCM, the MMIC chip is installed in a designated compartment of the module. For that installation, the back metal layer of the MMIC chip is attached by solder or conductive epoxy to the larger, thicker, more rigid metal carrier of the MCM. Typically, the module may be closed with a cover. The foregoing package structure is known, and, for additional details thereof the reader may refer to the technical literature.

Apart from the MCM housing or package, the MMIC chips are not otherwise packaged. The package and chip combination during operation is subject to the thermomechanical infirmities and resultant failure previously referred to in the background. The present invention encompasses the packaging of the chip, referred to as chip or wafer-level packaging, in which the chip and package form a single piece structure that avoids the described infirmities.

Figure 1:
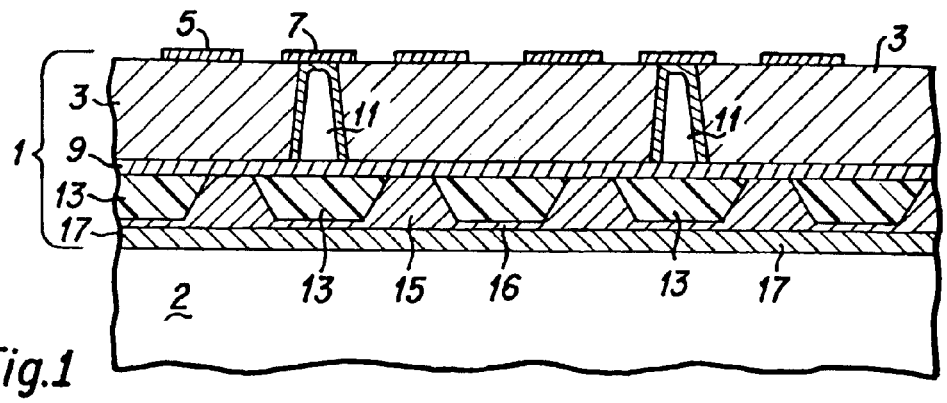
FIG. 1 illustrates an embodiment of the packaged MMIC wafer in a not-to-scale side section view.

FIG. 1 pictorially illustrates a basic embodiment of the packaged MMIC chip 1 in a greatly enlarged not-to-scale partial side section. For clarity, all walls of the package that houses the chip are omitted from the illustration, except bottom wall 2, referred to herein as the metal carrier. Chip 1 contains the slab of semiconductor material 3 on which the semiconductor integrated circuits ("ICs") 5 and front side via pads 7, only one of which is labeled, are formed. The integrated circuits are only partially symbolically illustrated in the figure and only one of those ICs is labeled. The integrated circuits are formed on (and/or in) the semiconductor layer, and, typically, produce minor protrusions or texture on an otherwise relatively flat smooth surface of semiconductor slab 3. The details of the fabrication of the integrated circuits and via pads in the semiconductor material are well known. Since those details are not material to the invention, they need not be further described.

A back metal 9 layer is located on the bottom side of semiconductor layer 3. Typically, the back metal layer serves as a ground plane of the chip. The chip also includes various electrical vias 11 extending between pads 7 and back metal 9; layer 13, the stress relief buffer layer, which comprises a layer of low modulus electrical insulating material with a favorable CTE, various vias 15 and an electrically conductive bonding layer 17. Vias 15 serve to electrically connect the chip to the package through electrically conductive bonding layer 17. The bonding layer may comprise a eutectic solder or conductive epoxy, either of which may be used in alternative embodiments to mechanically and electrically connect the chip to metal carrier 2 of the package.

The vias are generally conical in shape, and are typically formed by plating conical passages that extend through the respective semiconductor slab 3 and buffer layer 13, formed by etching through those layers. Vias 11 electrically connect respective specific ground locations in via pads 7 on the upper side of the chip to back metal layer 9 on the bottom side.

Back metal layer 9 is covered by buffer layer 13, which underlies the back metal. For production efficiency, both the back metal layer and the buffer layer are preferably formed on the wafer in which the large numbers of chips are concurrently fabricated prior to dicing individual chips from the wafer. The buffer layer 13 is formed of a thin layer of electrical insulator (dielectric) material, that is, for one, elastic in nature, suitably a polymer material such as polyimide or parylene being preferred. The buffer layer 13 is covered by the conductive bonding layer 17. Metal layer 9 is relatively thin, suitably approximately three to five microns thick in one practical embodiment, whereas metal layer 17 is typically thicker, 75 to 150 microns as example, and characteristic of eutectic solder or conductive epoxy. The foregoing layers are permanently attached to another to form an integral assembly with the chip. Bonding layer 17 is bonded to the carrier layer 2 to install the chip in place in the package to complete the packaged chip.

An additional set of vias 15 extend through buffer layer 13 to electrically connect the conductive bonding layer 17 to back metal layer 9, placing the two metal layers electrically in common, and through vias 11 placing the conductive bonding layer in contact with the via pads 7 on the upper surface of the chip. Via pads 7 may be electrically connected by electrical leads, not illustrated, located on the upper chip surface to various ones of the integrated circuits 5 and the like.

Buffer layer 13 may not visually appear as a continuous layer in this side section view due to the penetration in the section view made by vias 15. Those vias are understood to produce minute small diameter perforations through buffer layer 13, and the continuum of the buffer layer is illustrated by the dotted line along the base of the frusto-conical geometry of those vias. The chip may contain many such vias. Further, the plating metal that is used to form vias 15 also plates the outer surface of the buffer layer, as is illustrated at 16. That very thin metal layer may remain in place to enhance the attachment of bonding layer 17 to buffer layer 13, irrespective of whether solder or conductive epoxy is selected for the bonding layer.

Stress relief buffer 13 is a flexible dielectric insulating coating that adheres to metal and serves as a stress relief buffer on the backside of MMIC chip 1, absorbing any thermally induced stress between the wafer (including the thin back metal layer 9) and the outer metal carrier layer 2 of the MCM housing, including the metal bonding layer 17, to which the carrier layer is bonded or otherwise attached. Any stress created by differences in CTE between carrier layer 2 and the semiconductor slab 3 of the chip as the temperature rises (or falls) is absorbed in the elasticity of the buffer without damage to the wafer. Ideally, the dielectric material of layer 13 has a CTE that is as close as practical to the CTE of the semiconductor material of the wafer so as to minimize thermal stress between carrier layer 2 and the wafer when temperature changes.

The material of insulator layer 13 must also be capable of being etched to form the through-hole passages between the upper and lower surfaces of the insulator in which vias 15 are formed by conventional electroplating or electroless plating techniques. A polymer fulfills the foregoing requirements, and parylene and polyimide are preferred polymers.

More specifically, a polyimide, specifically, biphenyl dianhydride pphenylenediamine ("BPDA-PDA"), possesses a low coefficient of thermal expansion of about 3.8 ppm/C, is elastic (e.g. possesses a low modulus of elasticity of 8.9 Giga Pascals ("GPa")), produces low stress on the chip, is applied at low temperature, such as by vapor deposition, so as to avoid thermal damage to the chip, is able to withstand temperatures of up to 280 degrees Centigrade, and can be dry etched for patterning vias. Similarly, parylene C, poly-para-xylyene, possesses a modulus of elasticity of 3.2 GPa, which is desirably low, a CTE of 3.5 ppm/C, and also produces low stress on the chip and can be chemically etched for patterning vias. Although the CTE of parylene C is not as close to the CTE of GaAs, which is approximately 5.0 ppm/C as that of the polyimide, the elasticity of the parylene is much better than that of the polyimide. As is apparent, the greater the mismatch in CTE between the material of the stress relief buffer and that of the chip and the carrier material, the greater elasticity is required of the material of the stress relief buffer to avoid overstressing the chip. As those skilled in the art should appreciate, the foregoing are but two examples of suitable materials. Other suitable materials should be found by applying other likely candidates in a prototype and operating the prototype over the desired temperature range intended for the MCM.

In a practical embodiment, chip 3 is suitably formed of gallium arsenide, vias 11 and 15 are formed of gold, back metal layer 9 comprises gold and conductive bonding layer 17 comprises eutectic solder or a silver-filled electrically conductive epoxy. A typical chip may be about 90 to 100 mils in length, about 40 to 100 mils in width, and two to eight mils thick. Additionally, in that embodiment, bonding layer 11 is approximately three to six mils thick, and stress relief buffer 13, the polymer, is approximately two to eight microns thick. Vias 15 are about 80 microns in diameter at the conical base and 30 microns diameter and the smaller end.

Chip 1 is fabricated using known wafer fabrication techniques conventional in the semiconductor industry, the details of which are not necessary to the understanding of the package invention and need not be described. If the polymer selected for the stress relief buffer 13 is polyimide, a spin coating procedure is used to apply the layer to the wafer. In that process, the wafer is placed on a spinning vacuum chuck and liquid polyimide is dispensed onto the rotating chip. Centrifugal force acting on the liquid spreads the liquid evenly over the surface of the wafer. After spinning, the polyimide is then cured, typically by baking the assembly to transform the aminde groups into imide groups and drive out the water byproduct. The polyimide then transitions to a solid form producing a coating layer that is firmly attached to the chip by chemical and physical bonds. Alternatively, if the selected polymer is parylene, the wafer is placed in an inverted position in a vapor deposition chamber and the layer of parylene 13 is deposited on metal layer 9 by the vapor deposition process, attaching to and covering the wafer.

Using known photolithographic photoresist and etch techniques, the through hole passages for vias 15 are etched through the polymer layer at the locations desired. This may be accomplished using known dry etching procedures. In these procedures, the assembly is placed in a plasma vacuum chamber and the plasma physically and/or chemically etches the polymer. Other forms of etching may be employed as an alternative.

Following the etching of those through-holes, the holes are metallized, using known sputter or evaporation techniques to apply a metal seed layer in the walls of the through-holes and on the outside surface that is 10 to 1000 angstroms in thickness. Subsequently the surface is plated and the through-holes are filled with metal, such as gold, to form metal layer 16, which extends along the plane of the chip surface. Following fabrication of the polymer, the bonding metal layer 17 is formed by bonding the chip to carrier layer 2 with a eutectic solder or with a conductive epoxy.

In the packaged chip embodiment of FIG. 1, the integrated circuits are uncovered. As installed in the MCM, the integrated circuits on the chip are covered only by the lid of the package, which doesn't contact the upper surface of the chip, but is separated therefrom by some clearance. In those instances in which the chip is to be protected from all outside contaminants, the chip package is hermetically sealed. Typically, hermetic sealing requires filling the package cavity with an inert gas prior to fastening the lid. The lid to the package is then welded closed. However, due to the welding requirement the package is relatively heavy.

The embodiment of FIG. 1 may be modified to accomplish substantially all of the benefit of a hermetically sealed package and avoid the necessity for a gas fill and lid welding. Recognizing that the polymer employed as the stress relief buffer 13 in FIG. 1 is a relatively impervious material, is available in a fluid state that solidifies after the polymer is cured, and is suitable for use in MCM application, the same polymer may be employed on the upper surface of the chip to function as a protective coating or casement for the integrated circuits. Such an embodiment of the invention is illustrated in FIG. 2 to which reference is made.

Figure 2:
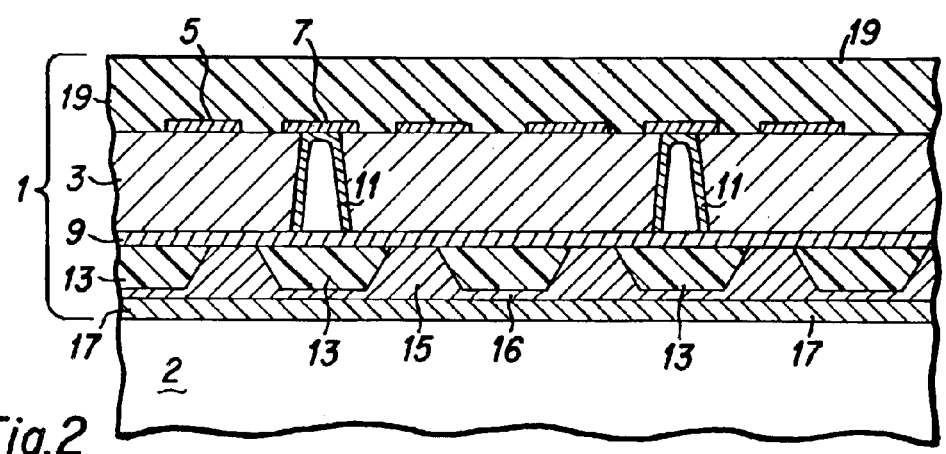
FIG. 2 illustrates another embodiment of the packaged MMIC wafer in another not-to-scale side section.

For convenience the elements of the packaged chip that appear in this view that are the same as those that appeared in FIG. 1 are identified in FIG. 2 by the same number used in the former figure. FIG. 2 pictorially illustrates an improved embodiment of the packaged MMIC chip 1 in a greatly enlarged not-to-scale partial side section. As before, for clarity of illustration, all the walls of the package housing the chip are omitted, except metal carrier 2. As may be noted, most all the elements are the same as in the embodiment of FIG. 1. Hence, the description of those elements need not be repeated.

In this embodiment, the upper surface of semiconductor layer 3 of the chip, including the integrated circuits 5 and via pads 7 are covered by an additional layer 19 to form a smooth flat surface to the upper side of the MMIC chip. That Layer is formed of a dielectric material, suitably a polymer, and essentially encapsulates, seals and protects the chip. For ease of manufacture, the polymer of layer 19 is formed of the same polymer used for stress relief buffer 13, such as Parylene or polyimide. As one appreciates the packaged chip is slightly greater in height than an unpackaged chip, and all of the required electrical connections are present in the packaged chip.

The polymer layer 19 provides a degree of protection for the chip suitable for many applications. The structure avoids the necessity for welding a heavy metal lid to cover the chip package, the MCM. As a result, the foregoing MMIC chip package is inexpensive relative to one that is fabricated to a package hermetically sealed using conventional techniques.

An additional advantage to using an etchable dielectric material, such as parylene, to cover the top surface of the wafer, such as the dielectric layer 19, in FIG. 2, is that it is then possible to stack two or more MMIC chips on top of one another in the MCM. Such an arrangement increases the packing factor of MMIC chips in a MCM. Further, it is possible to make electrical connections between stacked chips.

An additional advantage, the invention permits MMIC chips to be stacked one on top of the other in a unitary assembly prior to packaging in the MCM. Reference is made to the section view of FIG. 3, which illustrates such a stacked chip assembly. In this embodiment, the assembly is formed of two chips 1 and 1', the lower one 1 of which appears in the structure of the embodiment of FIG. 2 and the upper chip 20, which contains many of the elements of the embodiment of FIG. 1. For convenience the elements of the packaged chip that appear in this figure that are the same as those that appeared in FIGS. 1 and 2 are identified in FIG. 3 by the same number used in the former figures.

The packaged chip embodiment of FIG. 1 contains chip 1, which includes the semiconductor layer 3 containing integrated circuits 5 and via pads 7, vias 11, and back metal 9, and the stress relief buffer 13, including vias 15 through the buffer, and bonding layer 17. The polymer layer 19 overlies the upper surface of semiconductor layer 3. Only in this embodiment of FIG. 3 polymer layer 19 is not the outer surface of the assembly, but constitutes an intermediate layer and that layer containing through-hole vias 21 and 23, later herein more fully described. A second chip 20 contains the thick semiconductor layer 3', that contains integrated circuits 5' and via pads 7', and back metal 9'. For convenience, those elements of chip 20 that are of the same materials and functions of the elements included in chip 1 are denominated by the same number of the corresponding element and that number is primed. The back metal 9' is bonded to layer 19.

A protective layer 19' covers the upper surface of the stacked chip assembly. That protective layer accomplishes the same functions as the protective layer used in the embodiment of FIG. 2 and is of the same preferred dielectric material, a non-conductive polymer. To package the stacked chip assembly, bonding layer 17 is bonded to the carrier metal 2 of the MCM package.

The intermediate layer 19 between the stacked chips, includes at least two types of vias 21 and 23. The first set of vias 21 extend the electrical connection from the metal carrier 2 and back metal 9 of chip 1 through to the back metal 9' of the upper chip 20. More particularly, an electrical ground at metal carrier 2 is connected by via 15 to back metal 9. From back metal 9 the ground is extended to via pad 7, and may be distributed to the electronic circuits on the upper surface of semiconductor layer 3. Via pad 7 is connected to via 21 in the intermediate layer. That via extends into contact with the back metal 9' of chip 20, directly or through a bonding agent, not illustrated, thereby extending ground thereto. Lastly via 11' in chip 20, extends the connection and ground through semiconductor layer 3' to the via pad 7' on the upper side of the semiconductor layer, where ground may be distributed, not illustrated, to the various integrated circuits.

The second set of vias 23 extend from integrated circuits 5 in semiconductor layer 3, through the dielectric 19, and connect to an end of via 25 in dielectric layer 3' of chip 20. Via 25 extends through passages in back metal 9' semiconductor layer in a non-contacting manner so that via 25 does not contact the metal and ground out the signal line between the vertically displaced integrated circuits. The foregoing should be recognized as a pictorial illustration, presented to illustrate the potential of the stacked chip arrangement and the extension of a signal line between integrated circuits.

With the vias 23 formed in one of the layers 19 in one chip aligned with other vias 25 through the back metal layer 9' of the other chip, when the two chips are joined in abutting relationship, the electrical signal circuits connect those vias and form the signal path between the two chips.

Figure 3:
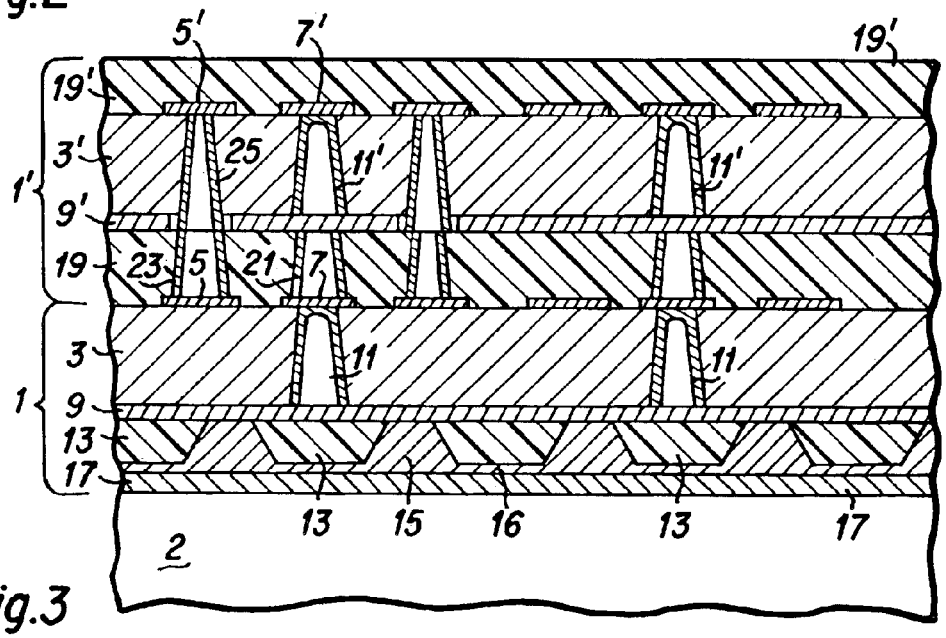
FIG. 3 illustrates, not to scale, a further embodiment of the invention containing packaged stacked MMIC chips.

Each semiconductor chip in the embodiment of FIG. 3, comprising the semiconductor layer 3 with internal vias 11 and back metal layer 20 in the case of chip 1 and the semiconductor layer 3', with internal vias 11', and back metal layer 20 in the case of chip 20, is preliminarily fabricated in the same manner as described for the embodiment of FIG. 1, which is not repeated. Chip 1, which serves as the lower one in the stack is processed further to apply the stress relief buffer 13, the internal vias 15 through the buffer and the electrically conductive bonding layer 17, as was described in connection with the embodiment of FIG. 1, which, also, is not repeated. The intermediate polymer layer 19 is applied to the upper surface of semiconductor slab 3 in the same procedure as described for the protective layer 19 in the embodiment of FIG. 2, earlier described, which is not repeated. Additionally layer 19 is masked and etched to form the through-holes for vias 21 and 23, and then plated to form those vias.

The back metal 9' of the upper chip 20 in the stack is masked and etched to form the openings for signal vias 25. Chip 20 is then carefully aligned and bonded, not illustrated, to intermediate layer 19 to integrate the two chips into a stacked assembly. Thereafter the outer protective layer 19', a polymer, is formed on the upper surface of semiconductor slab 3'. To apply the protective polymer layer 19' atop chip 20, the same procedure is used as was used for the application of the polymer used for the stress relief buffer 17 and intermediate layer 19; either the spin coating procedure, if polyimide was used, and vapor deposition procedure, if parylene was used. The polymer layer is formed on surface of semiconductor layer 3 to hermetically seal the chip and protect integrated circuits 5. Once completed, the chip may then be inserted into the MCM housing and be soldered to the metal carrier 2 of the MCM housing using a gold plated Kovar alloy or A40.

As should be appreciated, the embodiment of FIG. 3 provides the means to enable an MCM package to house a greater number of chips than previously or to reduce the area or volume of the MCM module.

It is believed that the foregoing description of the preferred embodiments of the invention is sufficient in detail to enable one skilled in the art to make and use the invention without undue experimentation. However, it is expressly understood that the detail of the elements comprising the embodiment presented for the foregoing purpose is not intended to limit the scope of the invention in any way, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A packaged semiconductor chip designed for operation throughout a predetermined range of ambient temperature, comprising:

a metal carrier possessing a first coefficient of thermal expansion;

a semiconductor chip, said semiconductor chip containing upper and lower surfaces and including at least one integrated circuit on said upper surface and a plurality of via bonding pads on said upper surface, and a plurality of vias extending from said lower surface through the thickness of said semiconductor chip to respective ones of said via bonding pads, said semiconductor chip possessing a second coefficient of thermal expansion different from said first coefficient of thermal expansion;

a back metal layer attached to said lower surface of said semiconductor chip, said back metal layer being thin relative to the thickness of said semiconductor chip;

a stress relief buffer for absorbing any strain produced by differences in thermal expansion between said semiconductor chip and said metal carrier due to changes in ambient temperature within said predetermined range of temperature, said stress relief buffer attached to and covering said back metal layer;

an electrically conductive bonding layer attached to and covering said stress relief buffer for bonding said metal carrier to said stress relief buffer;

said stress relief buffer including a plurality of vias, said vias extending from contact with said electrically conductive bonding layer through the thickness of said stress relief buffer and into contact with said back metal layer;

said stress relief buffer having a third coefficient of thermal expansion and a low modulus of elasticity, said third coefficient of thermal expansion being of a value nearer to that of said second coefficient of thermal expansion than to said first coefficient of thermal expansion, whereby strain produced by difference in thermal expansion between said semiconductor and said metal carrier is absorbed in said stress relief buffer;

said stress relief buffer comprising an electrically non-conductive chemically etchable polymer.

2. The packaged semiconductor chip as defined in claim 1, further comprising: a protective layer of dielectric material attached to and covering said upper surface of said semiconductor chip for protecting said upper surface, including said integrated circuit and bonding pads, from particle contamination and emulate a hermetic seal of said semiconductor chip.

3. The packaged semiconductor chip as defined in claim 2, wherein said semiconductor chip comprises any of gallium arsenide and indium phosphide, said back metal comprises a layer of gold, said carrier metal comprises aluminum, and said polymer comprises one of the group consisting of polyimide and parylene.

4. The packaged semiconductor chip as defined in claim 1, wherein said polymer comprises paraylene.

5. The packaged semiconductor chip as defined in claim 1, wherein said polymer comprises polyimide.

6. The packaged semiconductor wafer as defined in claim 1, wherein said back metal (9) of the chip comprises a thickness of five microns, said conductive bonding layer (17) comprises a thickness of about three to six mils, said chip (3) comprises a thickness of between 2 and 10 mils, exclusive of said back metal, and said polymer (13) comprises a thickness of about two to eight microns.

7. The packaged semiconductor wafer as defined in claim 2, wherein said back metal (9) of the chip comprises a thickness of five microns, said conductive bonding layer (17) comprises a thickness of about three to six mils, said chip (3) comprises a thickness of between 2 and 10 mils, exclusive of said back metal, said polymer (13) comprises a thickness of about two to eight microns, and said protective layer (19) comprises a thickness of about two to eight microns.

8. A packaged semiconductor chip designed for operation throughout a predetermined range of ambient temperature, comprising:

a metal carrier possessing a first coefficient of thermal expansion;

a semiconductor chip, said semiconductor chip including a layer of semiconductor material, containing upper and lower surfaces; said layer of semiconductor material including at least one integrated circuit, a plurality of via bonding pads on said upper surface, and a plurality of vias extending from said lower surface through the thickness of said layer of semiconductor material to respective ones of said via bonding pads, said semiconductor chip possessing a second coefficient of thermal expansion different from said first coefficient of thermal expansion;

a back metal layer attached to said lower surface of said layer of semiconductor material, said back metal layer being thin relative to the thickness of said layer of semiconductor material;

a stress relief buffer, said stress relief buffer being electrically non-conductive and being attached to and covering said back metal layer and for absorbing any strain produced by differences in thermal expansion between said semiconductor chip and said metal carrier due to changes in ambient temperature within said predetermined range of temperature;

an electrically conductive bonding layer attached to and covering said stress relief buffer for bonding said metal carrier to said stress relief buffer;

said stress relief buffer including a plurality of vias, said vias extending from contact with said electrically conductive bonding layer through the thickness of said stress relief buffer and into contact with said back metal layer;

said stress relief buffer for absorbing strain produced between said semiconductor and said metal carrier due to a difference in thermal expansion or contraction resulting from a change of temperature within said predetermined range of temperature, said stress relief buffer having a third coefficient of thermal expansion and a low modulus of elasticity, said third coefficient of thermal expansion being of a value more near in value to that of said second coefficient of thermal expansion than to said first coefficient of thermal expansion.

* * * * *